(12) United States Patent
Nakamura

(10) Patent No.: US 6,635,969 B1
(45) Date of Patent: Oct. 21, 2003

(54) SEMICONDUCTOR DEVICE HAVING CHIP-ON-CHIP STRUCTURE, AND SEMICONDUCTOR CHIP USED THEREFOR

(75) Inventor: Tomofumi Nakamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/511,104

(22) Filed: Feb. 23, 2000

(30) Foreign Application Priority Data

Feb. 23, 1999 (JP) ............................................ 11-045212

(51) Int. Cl.[7] ........................ H01L 23/48; H01L 23/52; H01L 29/40
(52) U.S. Cl. ........................................ 257/777; 257/777
(58) Field of Search ................................ 257/686, 737, 257/738, 778, 779, 735, 40, 777, 773, 774, 775; 428/545, 209, 210; 228/180, 22

(56) References Cited

U.S. PATENT DOCUMENTS

| | | | | | |
|---|---|---|---|---|---|
| 5,828,128 | A | * | 10/1998 | Higashiguchi et al. ...... | 257/738 |
| 6,239,366 | B1 | * | 5/2001 | Hsuan et al. .............. | 174/52.3 |
| 6,384,701 | B1 | * | 5/2002 | Yamada et al. ............. | 333/247 |

FOREIGN PATENT DOCUMENTS

| JP | 62122256 A | * | 6/1987 |
|---|---|---|---|
| JP | 63-141356 | | 6/1988 |
| JP | 63-142663 | | 6/1988 |
| JP | 03-009555 | | 1/1991 |
| JP | 7-249732 | | 9/1995 |
| JP | 10-335576 | | 12/1998 |

* cited by examiner

Primary Examiner—Wael Fahmy
Assistant Examiner—Dana Farahani
(74) Attorney, Agent, or Firm—Rabin & Berdo, P.C.

(57) ABSTRACT

A semiconductor device having a chip-on-chip structure including a first semiconductor chip having a connecting member formed on its surface, and a second semiconductor chip overlapped with and joined to the surface of the first semiconductor chip and having a connecting member adhering to the connecting member in the first semiconductor chip on its surface opposite to the first semiconductor chip. An inter-chip sealing layer is provided between the first semiconductor chip and the second semiconductor chip. The connecting members may be respectively bumps formed in a raised state on the surfaces of the first semiconductor chip and the second semiconductor chip.

8 Claims, 5 Drawing Sheets

F I G. 1
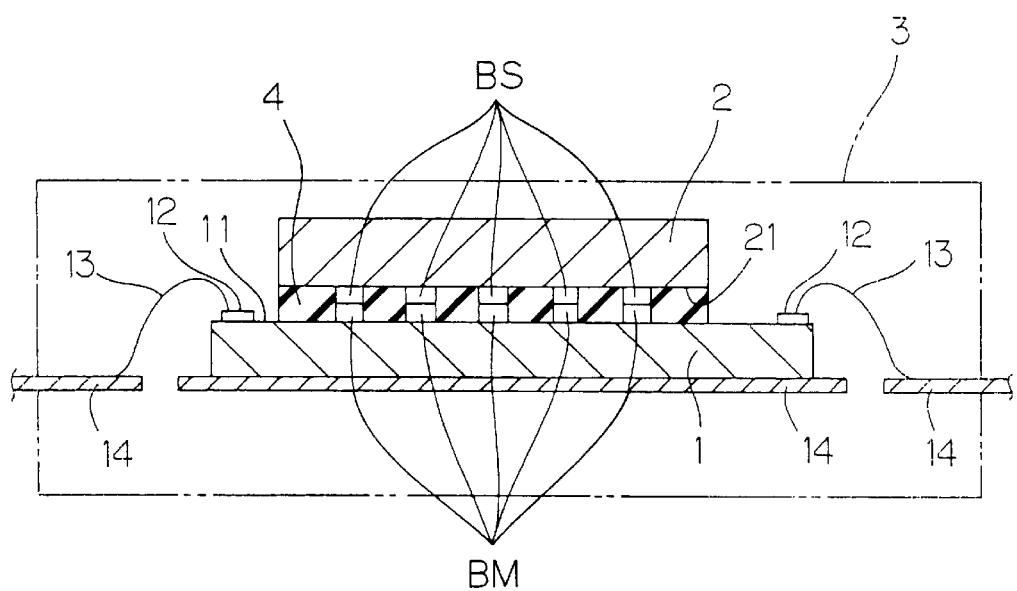

F I G. 4A
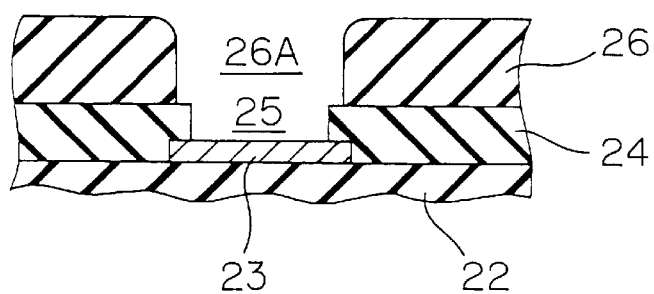
F I G. 4B
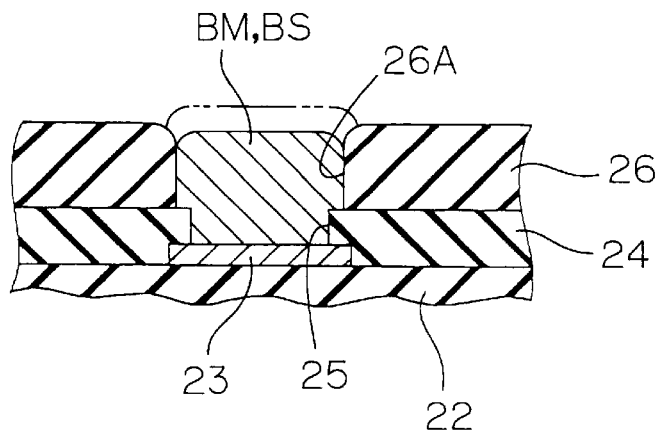

F I G. 5
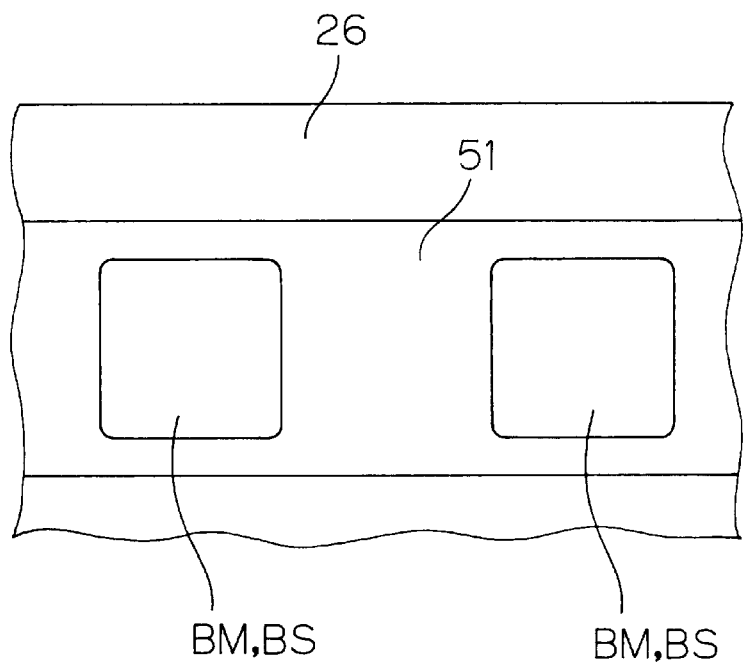

F I G. 6
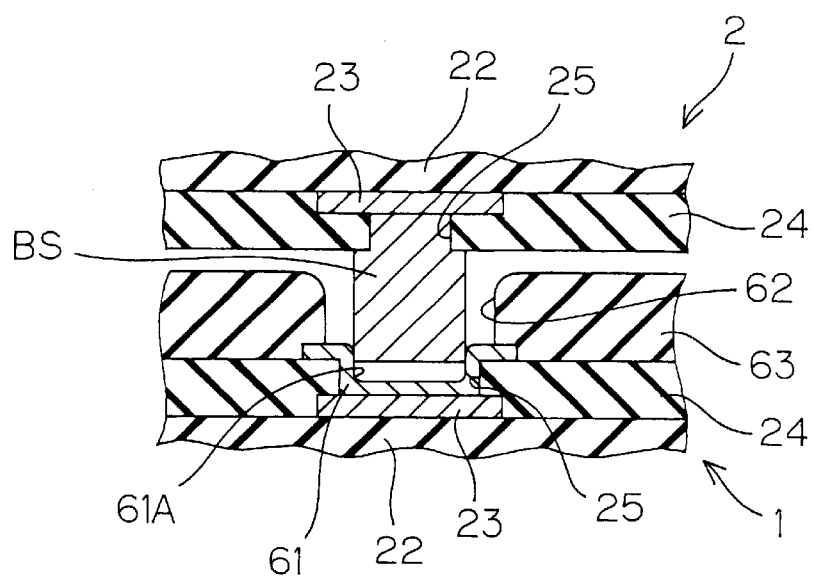

SEMICONDUCTOR DEVICE HAVING CHIP-ON-CHIP STRUCTURE, AND SEMICONDUCTOR CHIP USED THEREFOR

BACKGROUND OF THE INVENTION

1. Field of the Invention

The present invention relates to a semiconductor device having a chip-on-chip structure in which semiconductor chips are joined to each other by overlapping one of the semiconductor chips with the surface of the other semiconductor chip, for example, and a semiconductor chip used therefor.

2. Description of Related Art

Examples of a structure for miniaturizing and increasing the integration density of a semiconductor device include a so-called chip-on-chip structure in which paired semiconductor chips are overlapped with and joined to each other such that their surfaces are opposite to each other.

A semiconductor chip which is applied to the chip-on-chip structure has a plurality of bumps provided on its surface opposite to the other semiconductor chip. In joining the paired semiconductor chips to each other, the respective bumps in the opposite semiconductor chips are pressed against each other with ACF (Anisotropic Conductive Film) interposed between the opposite semiconductor chips. Consequently, a portion between the paired semiconductor chips is sealed with the ACF. Further, a conductive capsule included in the ACF is crushed in respective joints of the bumps, so that energization is possible between the bumps which are joined to each other, thereby achieving electrical connection between the semiconductor chips.

In joining the bumps to each other, however, the conductive capsule in the ACF has to be crushed, so that a relatively long time period (approximately 30 seconds) is required until its conductivity is exhibited. In the semiconductor device having the conventional chip-on-chip structure, therefore, a long time period is required for the fabricating steps.

SUMMARY OF THE INVENTION

An object of the present invention is to provide a semiconductor device having a chip-on-chip structure capable of shortening a time period required for the fabrication.

Another object of the present invention is to provide a semiconductor chip having a structure capable of contributing to an improvement in the productivity of a semiconductor device having a chip-on-chip structure.

A semiconductor device according to the present invention comprises a first semiconductor chip having a connecting member formed on its surface; a second semiconductor chip overlapped with and joined to the surface of the first semiconductor chip and having a connecting member adhering to the connecting member in the first semiconductor chip formed on its surface opposite to the first semiconductor chip; and an inter-chip sealing layer for sealing a portion between the first semiconductor chip and the second semiconductor chip.

According to the present invention, the connecting member in the first semiconductor chip and the connecting member in the second semiconductor chip adhere to each other, so that the first semiconductor chip and the second semiconductor chip are connected to each other.

When the connecting members in the first and second semiconductor chips are composed of gold, a time period required for the connecting member in the first semiconductor chip and the connecting member in the second semiconductor chip to adhere to each other is a relatively short time period, for example, approximately 0.1 seconds. According to the construction of the present invention, therefore, a time period required to fabricate the semiconductor device can be made shorter, as compared with that in construction in which a connecting member in a first semiconductor chip and a connecting member in a second semiconductor chip are connected to each other with ACF (Anisotropic Conductive Film) interposed therebetween.

A portion between the first semiconductor chip and the second semiconductor chip is sealed with an inter-chip sealing layer. Therefore, it is possible to avoid such inconvenience that air, which otherwise exists in the portion between the first semiconductor chip and the second semiconductor chip, is thermally expanded, to damage the first semiconductor chip or the second semiconductor chip. When the first semiconductor chip and the second semiconductor chip are contained in a package, stresses exerted on the first semiconductor chip and the second semiconductor chip can be relieved by the inter-chip sealing layer, thereby making it possible to prevent the first semiconductor chip and the second semiconductor chip from being deformed.

The connecting members in the first semiconductor chip and the second semiconductor chip may be respectively bumps formed in a raised state on the surfaces of the first semiconductor chip and the second semiconductor chip. Further, the connecting member in the first semiconductor chip may be a bump formed in a raised state on the surface of the first semiconductor chip, and the connecting member in the second semiconductor chip may be a pad which is lower than the bump.

Further, the inter-chip sealing layer may be formed by pressing deformable sealing films, which are respectively provided on the surfaces of the first semiconductor chip and the second semiconductor chip, against each other.

In this case, it is preferable that a recess for exposing a front end of a connecting member is formed in at least one of the sealing films in the first semiconductor chip and the second semiconductor chip. Consequently, the sealing film may not be interposed between the connecting member in the first semiconductor chip and the connecting member in the second semiconductor chip, thereby making it possible to cause the connecting member in the first semiconductor chip and the connecting member in the second semiconductor chip to satisfactorily adhere to each other.

It is more preferable that an air extraction groove for extracting air in the recess at the time of joining the first semiconductor chip and the second semiconductor chip is formed in at least one of the sealing films in the first semiconductor chip and the second semiconductor chip. In pressing the sealing film in the first semiconductor chip and the sealing film in the second semiconductor chip against each other, therefore, the air in the recess in the sealing film is allowed to flow out through the air extraction groove. Consequently, it is possible to realize a semiconductor device in which the portion between the first and second semiconductor chips can be satisfactorily sealed without leaving the air between the first semiconductor chip and the second semiconductor chip, and no inconvenience may be caused by mixing bubbles with the portion between the first and second semiconductor chips.

Furthermore, the inter-chip sealing layer may be formed by pressing the deformable sealing film, which is provided in one of the first semiconductor chip and the second semiconductor chip, against the surface of the other of the first and second semiconductor chips. In this case, the connecting member in the first semiconductor chip may be a bump formed in a raised state on the surface of the first semiconductor chip, and the connecting member in the second semiconductor chip may be a pad which is lower than the bump. It is preferable that the sealing film is stacked on the second semiconductor chip and has an opening opposite to the pad. In joining the first semiconductor chip and the second semiconductor chip to each other, therefore, the bump in the first semiconductor chip is guided to the opening formed in the sealing film, so that a front end of the bump is abutted against the pad. Accordingly, the first semiconductor chip and the second semiconductor chip can be satisfactorily aligned with each other, and the first semiconductor chip and the second semiconductor chip can be reliably connected to each other.

It is preferable that an air extraction groove for extracting air in the opening at the time of joining the first semiconductor chip and the second semiconductor chip to each other is formed in the sealing film. By providing the air extraction groove, air between the sealing film and the bump entering the opening is allowed to flow out through the air extraction groove when the first semiconductor chip and the second semiconductor chip are joined to each other. Consequently, it is possible to realize a semiconductor device in which the portion between the first and second semiconductor chips can be satisfactorily sealed without leaving the air between the first semiconductor chip and the second semiconductor chip, and no inconvenience may be caused by mixing bubbles with the portion between the first and second semiconductor chips.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is an illustrative cross-sectional view showing the schematic construction of a semiconductor device according to an embodiment of the present invention;

FIGS. 4A and 4B are cross-sectional views for explaining an example of a method of forming a bump and a sealing film;

FIG. 5 is a plan view for explaining a modified example of a sealing film; and

FIG. 6 is a partially enlarged cross-sectional view showing a state before joining a primary chip and a secondary chip to each other in an enlarged manner in order to explain another embodiment of the present invention.

DESCRIPTION OF THE PREFERRED EMBODIMENTS

Figure 2:
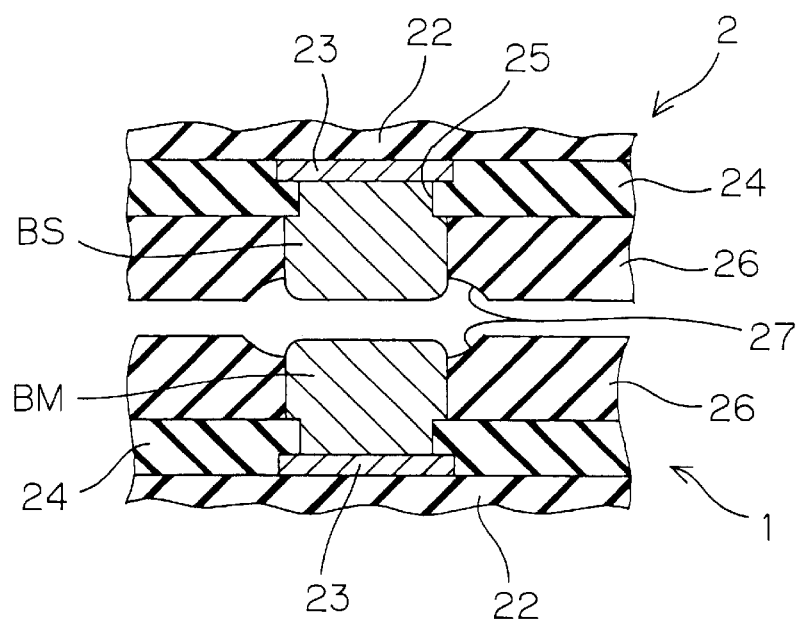
FIG. 2 is a partially enlarged cross-sectional view showing a state before joining a primary chip and a secondary chip to each other in an enlarged manner.

FIG. 1 is an illustrative cross-sectional view showing the schematic construction of a semiconductor device according to an embodiment of the present invention. The semiconductor device has a so-called chip-on-chip structure, and is constructed by overlapping and joining a daughter chip or secondary chip 2 with and to a surface 11 of a mother chip or primary chip 1 and then containing the chips in a package 3 composed of sealing resin.

The primary chip 1 and the secondary chip 2 are formed of a silicon chip, for example. The surface 11 of the primary chip 1 is a surface on the side of an active surface layer region where a functional device such as a transistor is formed on a semiconductor substrate which serves as a base body of the primary chip 1. A plurality of pads 12 for external connection are arranged in the vicinity of a peripheral edge of the surface 11. The pad 12 for external connection is connected to a lead frame 14 by a bonding wire 13. A plurality of bumps BM are arranged on the surface 11 of the primary chip 1 for electrical connection to the secondary chip 2.

The secondary chip 2 is joined to the primary chip 1 by a so-called face-down bonding in which its surface 21 is opposed to the surface 11 of the primary chip 1. The surface of the secondary chip 2 is a surface on the side of an active surface layer region where a functional device such as a transistor is formed on a semiconductor substrate which serves as a base body of the secondary chip 2. On the surface 21 of the secondary chip 2, a plurality of bumps BS connected to internal wiring are arranged opposite to the bumps BM on the primary chip 1. The secondary chip 2 is supported above the primary chip 1 and is electrically connected to the primary chip 1 by respectively connecting the bumps BS to the opposite bumps BM on the primary chip 1.

A portion between the primary chip 1 and the secondary chip 2 is sealed with an inter-chip sealing layer 4 having insulating properties. When the primary chip 1 and the secondary chip 2 are sealed in the resin package 3, therefore, it is possible to prevent air from entering the portion between the primary chip 1 and the secondary chip 2. Accordingly, it is possible to avoid such inconvenience that the air existing between the primary chip 1 and the secondary chip 2 is thermally expanded to damage the primary chip 1 or the secondary chip 2. Further, it is possible for the inter-chip sealing layer 4 to relieve stresses exerted on the primary chip 1 and the secondary chip 2 when the primary chip 1 and the secondary chip 2 are contained in the package 3, thereby making it possible to prevent the primary chip 1 and the secondary chip 2 from being deformed.

Figure 3:
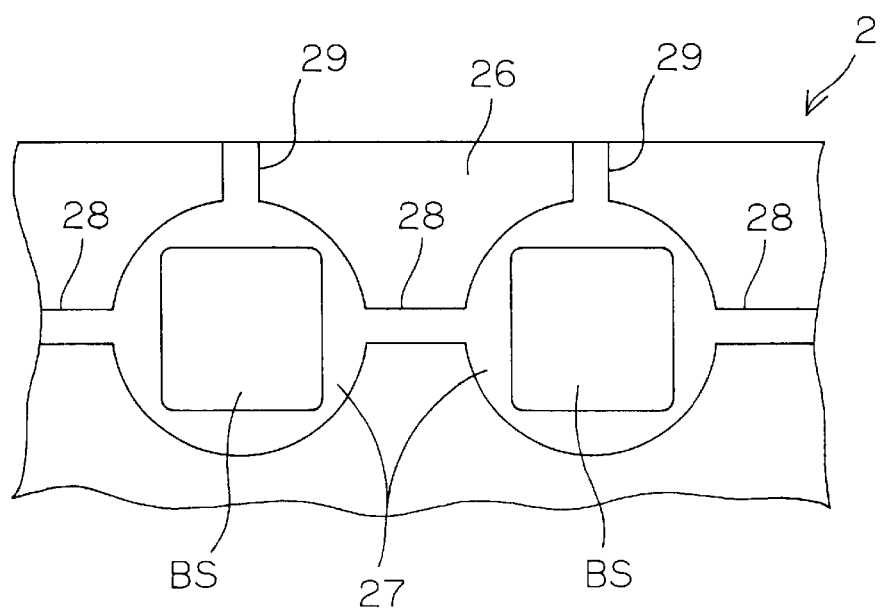
FIG. 3 is a plan view showing a part of the secondary chip in an enlarged manner.

FIG. 2 is a partially enlarged cross-sectional view showing a state before joining the primary chip 1 and the secondary chip 2 to each other in an enlarged manner. FIG. 3 is a plan view showing a part of the secondary chip 2 in an enlarged manner. Construction relating to the vicinity of the surface of the primary chip 1 is substentially the same as construction relating to the vicinity of the surface of the secondary chip 2. Accordingly, description will be made, centered with respect to the secondary chip 2. In FIG. 2, respective portions of the primary chip 1 are assigned the same reference numerals as those assigned to corresponding portions of the secondary chip 2.

An interlayer insulating film 22 composed of silicon oxide is formed on the semiconductor substrate (not shown) which is the base body of the secondary chip 2, and internal wiring 23 is disposed on the interlayer insulating film 22. The surfaces of the interlayer insulating film 22 and the internal wiring 23 are covered with a protective film 24 composed of silicon nitride, for example. A pad opening 25 for exposing a part of the internal wiring 23 is formed in the protective film 24.

A bump BS composed of an oxidation-resistant metal is formed in a raised state on the portion of the internal wiring 23 that is exposed from the protective film 24 through the pad opening 25. Examples of the oxidation-resistant metal include gold, platinum, silver, palladium, and iridium.

The surface of the protective film 24 is covered with a deformable sealing film 26. A recess 27 in a mortar shape, for example, is formed in association with each bump BS on the surface of the sealing film 26. A front end of the bump BS is projected into the recess 27 and is exposed from the sealing film 26. Further, communicating grooves 28 are formed on the surface of the sealing film 28. Each of the grooves 28 causes the recesses 27, which are adjacent to each other, to communicate with each other at the time of joining to the primary chip 1. In the vicinity of a peripheral edge of the secondary chip 2, air extraction grooves 29 for extracting air from the recess 27 are formed on the surface of the sealing film 26. Although in the present embodiment, the recesses 27, the communicating grooves 28, and the air extraction grooves 29 are formed in each of the primary chip 1 and the secondary chip 2, they may be formed only in the primary chip 1 or only in the secondary chip 2.

The sealing film 26 is composed of polyimide which is given photosensitivity, for example. The recesses 27, the communicating grooves 28, and the air extraction grooves 29 can be formed by performing exposure and developing processing. That is, the pad opening 25 is formed in the protective film 24, the bump BS is formed on the internal wiring 23 exposed through the pad opening 25, and sol-shaped photosensitive polyimide is then applied over the protective film 24, to form the sealing film 26. The sealing film 26 is formed to a larger thickness than the height of the bump BS, for example. A region, opposite to the bump BS, on the surface of the sealing film 26, a region where the communicating groove 28 should be formed, and a region where the air extraction groove 29 should be formed are irradiated with ultraviolet rays, to expose the regions. Thereafter, an exposed part of the surface of the sealing film 26 is melted with a solvent and is removed, thereby making it possible to form the patterns of the recess 27, the communicating groove 28, and the air extraction groove 29.

In joining the secondary chip 2 to the primary chip 1, the primary chip 1 and the secondary chip 2 are pressed against each other in a state where the bump BS is abutted against the bump BM in the primary chip 1. The bump BM in the primary chip 1 and the bump BS in the secondary chip 2 are made to adhere to each other by the pressing, thereby achieving electrical connection between the primary chip 1 and the secondary chip 2. The sealing film 26 in the primary chip 1 and the sealing film 26 in the secondary chip 2 are crushed, so that the recess 27, the communicating groove 28, and the air extraction groove 29 which are formed in each of the sealing films 26 are removed, to form an inter-chip sealing layer 4. A portion between the primary chip 1 and the secondary chip 2 is sealed by the inter-chip sealing layer 4. In the course of the sealing, air in the recess 27 is extracted outward from the portion between the primary chip 1 and the secondary chip 2 through the air extraction groove 29. Alternatively, the air flows through the communicating groove 28 into the recess 27 adjacent thereto, and is extracted outward through the air extraction groove 29 connected to the recess 27. Consequently, the air can be almost completely removed from the portion between the primary chip 1 and the secondary chip 2, thereby making it possible to satisfactorily seal the portion between the primary chip 1 and the secondary chip 2.

As described in the foregoing, according to the present embodiment, the bump BM in the primary chip 1 and the bump BS in the secondary chip 2 are made to directly adhere to each other, so that the primary chip 1 and the secondary chip 2 are electrically connected to each other. The sealing film 26 in the primary chip 1 and the sealing film 26 in the secondary chip 2 are joined to each other, to form the inter-chip sealing layer 4, thereby sealing the portion between the primary chip 1 and the secondary chip 2.

When the bumps BM and BS are composed of gold, for example, a time period required for the bump BM and the bump MS to adhere to each other is a relatively short time period, for example, approximately 0.1 seconds. According to the construction of the present invention, therefore, it is possible to make a time period required to fabricate the semiconductor device shorter, as compared with that in construction in which bumps BM and BS are connected to each other with ACF (Anisotropic Conductive Film) interposed therebetween.

Air between the sealing film 26 in the primary chip 1 and the sealing film 26 in the secondary chip 2 is almost completely removed at the time of joining the sealing films 26 (at the time of forming the inter-chip sealing layer 4). After the inter-chip sealing layer 4 is formed, the inter-chip sealing layer 4 prevents the air from entering the portion between the primary chip 1 and the secondary chip 2. Consequently, it is possible to realize a semiconductor device in which the portion between the primary chip 1 and the secondary chip 2 can be satisfactorily sealed, and no inconvenience may be caused by mixing bubbles with the portion between the primary chip 1 and the secondary chip 2.

Although in the present embodiment, the sealing films 26 are formed after the bumps BM and BS are formed, the bumps BM and BS may be formed after the sealing films 26 are formed. For example, as shown in FIG. 4A, a pad opening 25 is formed in a protective film 24, and a sealing film 26 is then formed on the protective film 24 outside the pad opening 25. In other words, a sealing film 26 having an opening 26A corresponding to the pad opening 25 is stacked on the protective film 24 having the pad opening 25 formed therein. As shown in FIG. 4B, bumps BM and BS may be formed by depositing materials for the bumps BM and BS by plating, for example, on internal wiring 23 exposed through the opening 26A and the pad opening 25.

Although in the present embodiment, the thickness of the sealing film 26 is set to a value larger than the height of the bumps BM and BS, the thickness of the sealing film 26 may be suitably changed depending on the materials for the sealing film 26 and the bumps BM and BS. For example, the thickness of the sealing film 26 may be set to a value smaller than the height of the bumps BM and BS, indicated by a phantom line in FIG. 4B. As the material for the sealing film 26, it is possible to use JCR (Junction Coat Resist: Trade Name) in addition to photosensitive polyimide.

Furthermore, although in the present embodiment, the recess 27 corresponding to each of the bumps BM and BS is formed on the surface of the sealing film 26, and the communicating groove 28 and the air extraction groove 29 extend from the recess 27, a stripe-shaped recess 51 may be formed along a chip peripheral edge on the surface of the sealing film 26, and front ends of the plurality of bumps BM and BS may be projected into the recess 51, as shown in FIG. 5, for example.

Furthermore, in the embodiment described above, the sealing film 26 has photosensitivity, and the recess 27, the communicating groove 28, and the air extraction groove 29 on the surface of the sealing film 26 are formed by exposure and development processing. However, the sealing film 26 may not have photosensitivity. In this case, the recess 27, the communicating grove 28, and the air extraction groove 29 can be formed by forming the pattern of a resist film on the sealing film 26 and etching away a portion, which is not covered with the resist film, of the sealing film 26.

FIG. 6 is a partially enlarged cross-sectional view showing a state before joining a primary chip 1 and a secondary chip 2 to each other in an enlarged manner in order to explain another embodiment of the present invention. Portions corresponding to the respective portions shown in FIG. 2 are assigned the same reference numerals as those shown in FIG. 2 and hence, description is made, centered with respect to the difference from the first embodiment.

In the present embodiment, the sealing film 26 provided on the surface of the secondary chip 2 in the first embodiment is omitted, and the surface of a protective film 24 in a secondary chip 2 is exposed. Further, a primary chip 1 is provided with a metal pad 61 in a thin film shape composed of an oxidation-resistant metal on a portion of an internal wiring 23 exposed from a protective film 24 through a pad opening 25. Staked on the protective film 24 is a sealing film 63 having an opening 62 corresponding to the metal pad 61.

When the primary chip 1 and the secondary chip 2 are joined to each other, a bump BS enters the opening 62 of the sealing film 63, a front end of the bump BS enters a recess 61A formed in the metal pad 61 in correspondence with the pad opening 25. The bump BS and the metal pad 61 are made to adhere to each other in a projection-dent coupling state. The sealing film 63 in the primary chip 1 is pressed against the protective film 24 in the secondary chip 2, so that there is no clearance between the sealing film 63 and the bump BS, to form an inter-chip sealing layer 4 (see FIG. 1). A portion between the primary chip 1 and the secondary chip 2 is sealed by the inter-chip sealing layer 4.

Even by the construction of the present embodiment, therefore, it is possible to shorten a time period required to fabricate the semiconductor device, as in the construction of the first embodiment. Further, it is possible to realize a semiconductor device in which a portion between the primary chip 1 and the secondary chip 2 can be satisfactorily sealed, and no internal stress may be caused by mixing bubbles.

Moreover, in the present embodiment, in joining the primary chip 1 and the secondary chip 2 to each other, the bump BS is guided to the opening 62 formed in the sealing film 63, and the front end of the bump BS enters the recess 61A in the metal pad 61, to achieve projection-dent coupling. Accordingly, the primary chip 1 and the secondary chip 2 can be satisfactorily aligned with each other, and electrical connection between the primary chip 1 and the secondary chip 2 can be reliably formed.

Although in the present embodiment, the primary chip 1 is provided with the metal pad 61 and the sealing film 63, and the secondary chip 2 is provided with the bump BS, the primary chip 1 may be provided with a bump BM, and the secondary chip 2 may be provided with a metal pad 61 and a sealing film 63. Further, the primary chip 1 may be provided with a metal pad 61, and the secondary chip 2 may be provided with a bump BS and a sealing film 63. Alternatively, the primary chip 1 may be provided with a bump BM and a sealing film 63, and the secondary chip 2 may be provided with a metal pad 61.

Furthermore, it is preferable that an air extraction groove for extracting air in the opening 62 is formed on the surface of the sealing film 63. If the air extraction groove is provided, it is possible to cause the air between the sealing film 63 and the bump BS entering the opening 62 to flow out and completely remove the air from the portion between the primary chip 1 and the secondary chip 2 when the primary chip 1 and the secondary chip 2 are joined to each other, thereby making it possible to more satisfactorily seal the portion between the primary chip 1 and the secondary chip 2.

Although description has been made of the embodiments of the present invention, the present invention is not limited to the above-mentioned embodiments. Although both the primary chip 1 and the secondary chip 2 are chips composed of silicon, for example, a semiconductor chip may use another arbitrary semiconductor material such as a compound semiconductor (for example, a gallium arsenic semiconductor) or a germanium semiconductor in addition to silicon. A semiconductor material for the primary chip 1 and a semiconductor material for the secondary chip 2 may be the same as or different from each other.

Although the present invention has been described and illustrated in detail, it is clearly understood that the same is by way of illustration and example only and is not to be taken by way of limitation, the spirit and scope of the present invention being limited only by the terms of the appended claims.

This application claims priority benefits under USC §119 of Japanese Patent Application NO. 11-45212 filed with the Japanese Patent Office on Feb. 23, 1999, the disclosure of which is incorporated hereinto by reference.

What is claimed is:

1. A semiconductor device having a chip-on-chip structure, comprising:
    a first semiconductor chip having a connecting member formed on its surface;
    a second semiconductor chip overlapped with and joined to the surface of the first semiconductor chip and having a connecting member adhering to the connecting member in the first semiconductor chip formed on a surface of the second semiconductor chip opposite to the first semiconductor chip; and
    an inter-chip sealing layer for sealing a portion between the first semiconductor chip and the second semiconductor chip, wherein
    the inter-chip sealing layer is in a form of pressed deformable sealing films, which are respectively provided on the surfaces of the first semiconductor chip and the second semiconductor chip, against each other,
    a recess for exposing a front end of the connecting member is formed in at least one of the sealing films in the first semiconductor chip and the second semiconductor chip and
    an air extraction groove for extracting air in the recess at the time of joining the first semiconductor chip and the second semiconductor chip to each other is formed in at least one of the sealing films in the first semiconductor chip and the second semiconductor chip.

2. The semiconductor device according to claim 1, wherein
    the connecting members in the first semiconductor chip and the second semiconductor chip are respectively bumps formed in a raised state on the surfaces of the first semiconductor chip and the second semiconductor chip.

3. The semiconductor device according to claim 1, wherein
    the connecting member in the first semiconductor chip is a bump formed in a raised state on the surface of the first semiconductor chip, and the connecting member in the second semiconductor chip is a pad which is lower than the bump.

4. The semiconductor device according to claim 1, wherein
the inter-chip sealing layer is formed by pressing deformable sealing film, which is provided in one of the first semiconductor chip and the second semiconductor chip, against the surface of the other of the first and second semiconductor chips.

5. The semiconductor device according to claim 4, wherein
the connecting member in the first semiconductor chip is a bump formed in a raised state on the surface of the first semiconductor chip, and
the connecting member in the second semiconductor chip is a pad which is lower than the bump.

6. The semiconductor device according to claim 5, wherein
the sealing film is provided on the second semiconductor chip, and has an opening receiving the bump in a position corresponding to the pad.

7. The semiconductor device having a chip-on-chip structure, comprising:
a first semiconductor chip having a connecting member formed on its surface;
a second semiconductor chip overlapped with and joined to the surface of the first semiconductor chip and having a connecting member adhering to the connecting member in the first semiconductor chip formed on a surface of the second semiconductor chip opposite to the first semiconductor chip; and
an inter-chip sealing layer for sealing a portion between the first semiconductor chip and the second semiconductor chip, wherein the inter-chip sealing layer is in a form of pressed deformable sealing films, which is provided in one of the first semiconductor chip and the second semiconductor chip, against the surface of the other of the first and second semiconductor chips,
the connecting member in the first semiconductor chip is a bump formed in a raised state on the surface of the first semiconductor chip,
the connecting member in the second semiconductor chip is a pad which is lower than the bump,
the sealing film is provided on the second semiconductor chip and has an opening receiving the bump in a position corresponding to the pad and
an air extraction groove for extracting air in the opening at the time of joining the first semiconductor chip and the second semiconductor chip to each other is formed in the sealing film.

8. The semiconductor chip for a semiconductor device having a chip-on-chip structure constructed by overlapping and joining semiconductor chips with and to each other, wherein
the semiconductor chip has a deformable sealing film for sealing a portion between the chips on its joint surface to the other semiconductor chip and including a connecting member for connection to the other semiconductor chip,
the sealing film having a recess or an opening which exposes the connecting member,
the sealing film has an air extraction groove for extracting air in the recess or the opening on its surface at the time of joining to the other semiconductor chip.

* * * * *